United States Patent
Hammes (10) Patent No.: US 6,941,539 B2
(45) Date of Patent: Sep. 6, 2005

(54) EFFICIENCY OF RECONFIGURABLE HARDWARE

(75) Inventor: Jeffrey Hammes, Colorado Springs, CO (US)

(73) Assignee: SRC Computers, Inc., Colorado Springs, CO (US)

( * ) Notice: Subject to any disclaimer, the term of this patent is extended or adjusted under 35 U.S.C. 154(b) by 295 days.

(21) Appl. No.: 10/285,401

(22) Filed: Oct. 31, 2002

(65) Prior Publication Data

US 2004/0161162 A1 Aug. 19, 2004

(51) Int. Cl.⁷ .......................... G06F 17/50; G06F 19/00; G06F 9/445; G06F 15/177
(52) U.S. Cl. .............. 716/16; 716/18; 713/2; 713/100; 712/15
(58) Field of Search .............. 716/16, 18; 713/2, 713/100; 712/15

(56) References Cited

U.S. PATENT DOCUMENTS

| | | | |
|---|---|---|---|
| 5,230,057 A | | 7/1993 | Shido et al. |
| 5,570,040 A | | 10/1996 | Lytle et al. |
| 5,732,246 A | * | 3/1998 | Gould et al. ................... 716/16 |
| 5,737,766 A | | 4/1998 | Tan |
| 5,892,962 A | | 4/1999 | Cloutier |
| 5,903,771 A | | 5/1999 | Sgro et al. |
| 6,021,513 A | * | 2/2000 | Beebe et al. ................. 714/726 |
| 6,023,755 A | | 2/2000 | Casselman |
| 6,052,773 A | | 4/2000 | DeHon et al. |
| 6,076,152 A | | 6/2000 | Huppenthal et al. |
| 6,192,439 B1 | | 2/2001 | Grunewald et al. |
| 6,226,776 B1 | | 5/2001 | Panchul et al. |
| 6,668,237 B1 | * | 12/2003 | Guccione et al. ............ 702/119 |
| 6,832,310 B1 | * | 12/2004 | Bailey et al. .................. 713/1 |
| 6,839,889 B2 | * | 1/2005 | Liu .............................. 716/18 |

OTHER PUBLICATIONS

Kang, S.M. et al., "iiQueue, a QoS–Oriented Module for Input–Buffered ATM Switches", Proceedings of 1997 IEEE International Symposium on Circuits and Systems, Jun. 9, 1997, vol. 3, pp. 2144–2147.*

Kung, H.T., "Deadlock Avoidance for Systolic Communication", Conference Proceeding of 15th Annual International Symposium on Computer Architecture, May 30, 1998, pp. 252–260.*

Agarwal, A., et al., "The Raw Compiler Project", pp. 1–12, http://caq-www.lcs.mit.edu/raw, Proceedings of the Second SUIF Compiler Workshop, Aug. 21–23, 1997.

Albaharna, Osama, et al., "On the viability of FPGA–based integrated coprocessors", © 1996 IEEE, Publ. No. 0–8186–7548–9/96, pp. 206–215.

(Continued)

*Primary Examiner*—Matthew Smith
*Assistant Examiner*—Phallaka Kik
(74) *Attorney, Agent, or Firm*—Eugene J. Bernard; William J. Kubida; Hogan & Hartson LLP (57) ABSTRACT

The present invention includes a method of computing a function array in reconfigurable hardware that includes forming in the reconfigurable hardware a first delay queue and a second delay queue, inputting from a source array outside the reconfigurable hardware a first value into the first delay queue and a second value into the second delay queue, defining in the reconfigurable hardware a window array comprising a first cell and a second cell, inputting the first value from the first delay queue into the first cell and the second value from the second delay queue into the second cell, and calculating an output value for the function array based on the window array. The present invention also includes a method of loop stripmining and a method of calculating output values in a fused producer/consumer loop structure.

20 Claims, 9 Drawing Sheets

OTHER PUBLICATIONS

Amerson, Rick, et al., "Teramac—Configurable Custom Computing", © 1995 IEEE, Publ. No. 0–8186–7086–X/95, pp. 32–38.
Barthel, Dominique Aug. 25–26, 1997, "PVP a Parallel Video coPro cessor", Hot Chips IX, pp. 203–210.
Bertin, Patrice, et al., "Programmable active memories: a performance assessment", © 1993 Massachusetts Institute of Technology, pp. 88–102.
Bittner, Ray, et al., "Computing kernels implemented with a wormhole RTR CCM", © 1997 IEEE, Publ. No. 0–8186–8159–4/97, pp. 98–105.
Buell, D., et al. "Splash 2: FPGAs in a Custom Computing Machine—Chapter 1—Custom Computing Machines: An Introduction", pp. 1–11, http://www.computer.org/espress/catalog/bp07413/spls–ch1.html (originally believed published in J. of Supercomputing, vol. IX, 1995, pp. 219–230.
Casselman, Steven, "Virtual Computing and The Virtual Computer", © 1993 IEEE, Publ. No. 0–8186–3890–7/93, pp. 43–48.
Chan, Pak, et al., "Architectural tradeoffs in field–programmable–device–based computing systems", © 1993 IEEE, Publ. No. 0–8186–3890–7/93, pp. 152–161.
Clark, David, et al., "Supporting FPGA microprocessors through retargetable software tools", © 1996 IEEE, Publ. No. 0–8186–7548–9/96, pp. 195–103.
Cuccaro, Steven, et al., "The CM–2X: a hybrid CM–2/Xilink prototype", © 1993 IEEE, Publ. No. 0–8186–3890–7/93, pp. 121–130.
Culbertson, W. Bruce, et al., "Exploring architectures for volume visualization on the Teramac custom computer", © 1996 IEEE, Publ. No. 0–8186–7548–9/96, pp. 80–88.
Culbertson, W. Bruce, et al. "Defect tolerance on the Teramac custom computer", © 1997 IEEE, Publ. No. 0–8186–8159–4/97, pp. 116–123.
Dehon, Andre, "DPGA–Coupled microprocessors: commodity IC for the early $21^{st}$ century", © 1994 IEEE, Publ. No. 0–8186–5490–2/94, pp. 31–39.
Dehon, A., et al., "Matrix A Reconfigurable Computing Device with Configurable Instruction Distribution", Hot Chips IX, Aug. 25–26, 1997, Stanford, California, MIT Artificial Intelligence Laboratory.
Dhaussy, Philippe, et al., "Global control synthesis for an MIMD/FPGA machine", © 1994 IEEE, Publ. No. 0–8186–5490–2/94, pp. 72–81.
Elliott, Duncan, et al., "Computational Ram: a memory–SID hybrid and its application to DSP", © 1992 IEEE, Publ. No. 0–7803–0246–X/92, pp. 30.6.1–30.6.4.
Fortes, Jose, et al., "Systolic arrays, a survey of seven projects", © 1987 IEEE, Publ. No. 0018–9162/87/0700–0091, pp. 91–103.
Gokhale, M., et al., "Processing in Memory: The Terasys Massively Parallel PIM Array" © Apr. 1995, IEEE, pp. 23–31.
Gunther, Bernard, et al., "Assessing Document Relevance with Run–Time Reconfigurable Machines", © 1996 IEEE, Publ. No. 0–8186–7548–9/96, pp. 10–17.
Hagiwara, Hiroshi, et al., "A dynamically microprogrammable computer with low–level parallelism", © 1980 IEEE, Publ. No. 0018–9340/80/07000–0577, pp. 577–594.
Hartenstein, R. W., et al., "A General Approach in System Design Integrating Reconfigurable Accelerators," http://xputers.informatik.uni–ki.de/papers/paper026–1.html, IEEE 1996 Conference, Austin, TX, Oct. 9–11, 1996.
Hartenstein, Reiner, et al., "A reconfigurable data–driven ALU for Xputers", © 1994 IEEE, Publ. No. 0–8186–5490–2/94, pp. 139–146, Apr. 10, 1994.
Hauser, John et al.: "GARP: a MIPS processor with a reconfigurable co–processor", © 1997 IEEE, Publ. No. 0–8186–8159–4/97, pp. 12–21.
Hayes, John, et al., "A microprocessor–based hypercube, supercomputer", © 1986 IEEE, Publ. No. 0272–1732/86/1000–0006, pp. 6–17.
Herpel, H.–J., et al., "A Reconfigurable Computer for Embedded Control Applications", © 1993 IEEE, Publ. No. 0–8186–3890–7/93, pp. 111–120.
Hogl, H., et al., "Enable++: A second generation FPGA processor", © 1995 IEEE, Publ. No. 0–8186–7086–X/95, pp. 45–53.
King, William, et al., "Using MORRPH in an industrial machine vision system", © 1996 IEEE, Publ. No. 08186–7548–9/96, pp. 18–26.
Manohar, Swaminathan, et al., "A pragmatic approach to systolic design", © 1988 IEEE, Publ. No. CH2603–9/88/0000/0463, pp. 463–472.
Mauduit, Nicolas, et al., "Lneuro 1.0: a piece of hardware LEGO for building neural network systems,", © 1992 IEEE, Publ. No. 1045–9227/92, pp. 414–422.
Mirsky, Ethan, A., "Coarse–Grain Reconfigurable Computing", Massachusetts Institute of Technology, Jun. 1996, pp. 1–161.
Mirsky, Ethan, et al., "MATRIX: A Reconfigurable Computing Architecture with Configurable Instruction Distribution and Deployable Resources", © 1996 IEEE, Publ. No. 0–8186–7548–9/96, pp. 157–166.
Morley, Robert E., Jr., et al., "A Massively Parallel Systolic Array Processor System", © 1988 IEEE, Publ. No. CH2603–9/88/0000/0217, pp. 217–225.
Patterson, David, et al., "A case for intelligent DRAM: IRAM", Hot Chips VIII, Aug. 19–20, 1996, pp. 75–94.
Peterson, Janes, et al., "Scheduling and partitioning ANSI–C programs onto multi–FPGA CCM architectures", © 1996 IEEE, Publ. No. 0–8186–7548–9/96, pp. 178–187.
Schmit, Herman, "Incremental reconfiguration for pipelined applications," © 1997 IEEE, Publ. No. 0–8186–8159–4/97, pp. 47–55.
Sitkoff, Nathan, et al., "Implementing a Genetic Algorithm on a Parallel Custom Computing Machine", Publ. No. 0–8186–7086–X/95, pp. 180–187, IEEE, 1995.
Stone, Harold, "A logic–in–memory computer", © 1970 IEEE, IEEE Transactions on Computers, pp. 73–78, Jan. 1990.
Tangen, Uwe, et al., "A parallel hardware evolvable computer POLYP extended abstract", © 1997 IEEE, Publ. No. 0–8186–8159/4/97, pp. 238–239.
Thornburg, Mike, et al., "Transformable Computers", © 1994 IEEE, Publ. No. 0–8186–5602–6/94, pp. 674–679.
Tomita, Shinji, et al., "A computer low–level parallelism QA–2", © 1986 IEEE, Publ. No. 0–0384–7495/86/0000/0280, pp. 280–289.
Trimberger, Steve, et al., "A time–multiplexed FPGA", © 1997 IEEE, Publ. No. 0–8186–8159–4/97, pp. 22–28.
Ueda, Hirotada, et al., "A multiprocessor system utilizing enhanced DSP's for image processing", © 1998 IEEE, Publ. No. CH2603–9/88/0000/0611, pp. 611–620.
Villasenor, John, et al., "Configurable computing", © 1997 Scientific American, Jun. 1997, pp. 1–7.

Wang, Quiang, et al., "Automated field-programmable compute accelerator design using partial evaluation", © 1997 IEEE, Publ. No. 0-8186-8159-4/97, pp. 145-154.

W.H. Mangione-Smith and B.L. Hutchings. Configurable computing: The Road Ahead. In Proceedings of the Reconfigurable Architectures Workshop (RAW'97), pp. 81-96, 1997.

Wirthlin, Michael, et al., "The Nano processor: a low resource reconfigurable processor", © 1994 IEEE, Publ. No. 0-8186-5490-2/94, pp. 23-30.

Wirthlin, Michael, et al., "A dynamic instruction set computer", © 1995 IEEE, Publ. No. 0-8186-7086-X/95, pp. 99-107.

Wittig, Ralph, et al., "One Chip: An FPGA processor with reconfigurable logic", © 1996 IEEE, Publ. No. 0-8186-7648-9/96, pp. 126-135.

Yamauchi, Tsukasa, et al., "SOP: A reconfigurable massively parallel system and its control-data flow based compiling method", © 1996 IEEE, Publ. No. 0-8186-7548-9/96, pp. 148-156.

"Information Brief", PCI Bus Technology, © IBM Personal Computer Company, 1997, pp. 1-3.

Yun, Hyun-Kyu and Silverman, H. F.; "A distributed memory MIMD multi-computer with reconfigurable custom computing capabilities", Brown University, Dec. 10-13, 1997, pp. 7-13.

Hoover, Chris and Hart, David; "San Diego Supercomputer Center, Timelogic and Sun Validate Ultra-Fast Hidden Markov Model Analysis-One DeCypher-accelerated Sun Fire 6800 beats 2,600 CPUs running Linux-", San Diego Supercomputer Center, http://www.sdsc.edu/Press/02/050802_markovmodel.html, May 8, 2002, pp. 1-3.

Caliga, David and Barker, David Peter, "Delivering Acceleration: The Potential for Increased HPC Application Performance Using Reconfigurable Logic", SRC Computers, Inc., Nov. 2001, pp. 20.

Hammes, J.P., Rinker, R. E., McClure, D. M., Böhm, A. P. W., Najjar, W. A., "The SA-C Compiler Dataflow Description", Colorado State University, Jun. 21, 2001, pp. 1-25.

Callahan, Timothy J. and Wawrzynek, John, "Adapting Software Pipelining for Reconfigurable Computing", University of California at Berkeley, Nov. 17-19, 2000, pp. 8.

Ratha, Nalini K., Jain, Anil K. and Rover, Diane T., "An FPGA-based Point Pattern Matching Processor with Application to Fingerprint Matching", Michigan State University, Department of Computer Science, pp. 8, No Date.

Dehon, André, "Comparing Computing Machines", University of California at Berkeley, Proceedings of SPIE vol. 3526, Nov. 2-3, 1998, pp. 11.

Vemuri, Ranga R. and Harr, Randolph E., "Configurable Computing: Technology and Applications", University of Cincinnati and Synopsys Inc., IEEE, Apr. 2000, pp. 39-40.

Dehone, André, "The Density Advantage of Configurable Computing", California Institute of Technology, IEEE, Apr. 2000. pp. 41-49.

Haynes, Simon D., Stone, John, Cheung, Peter Y.K. and Luk, Wayne, "Video Image Processing with the Sonic Architecture", Sony Broadcast & Professional Europe, Imperial College, University of London, IEEE, Apr. 2000, pp. 50-57.

Platzner, Marco, "Reconfigurable Accelerators for Combinatorial Problems", Swiss Federal Institute of Technology (ETH) Zurich, IEEE, Apr. 2000, pp. 58-60.

Callahan, Timothy J., Hauser, John R. and Wawrzynek, John, "The Garp Architecture and C Compiler", University of California, Berkeley, IEEE, Apr. 2000, pp. 62-69.

Goldstein, Seth Copen, Schmit, Herman, Budiu, Mihai, Cadambi, Srihari, Moe, Matt and Taylor R. Reed, "PipeRench: A Reconfigurable Architecture and Compiler", Carnegie Mellon University, IEEE, Apr. 2000, pp. 70-76.

Muchnick, Steven S., "Advanced Compiler Design and Implementation", Morgan Kaufmann Publishers, pp. 214, No Date.

Hammes, Jeffrey, P., Dissertation "Compiling SA-C To Reconfigurable Computing Systems", Colorado State University, Department of Computer Science, Summer 2000, pp. 1-164.

Automatic Target Recognition, Colorado State University & USAF, http://www.cs.colostate.edu/cameron/applications.html, pp. 1-3, No Date.

Chodowiec, Pawel, Khuon, Po, Gaj, Kris, Fast Implementation of Secret-Key Block Ciphers Using Mixed Inner- and Outer-Round Pipelining, George Mason University, Feb. 11-13, 2001, pp. 9.

* cited by examiner

Fig. 1

ITERATION 0     ITERATION Si

ITERATION 1

ITERATION 2

Fig. 5

EFFICIENCY OF RECONFIGURABLE HARDWARE

BACKGROUND OF THE INVENTION

1. Field of the Invention

The present invention relates, in general, to improving processing efficiency in reconfigurable hardware. More specifically, the invention relates to optimizing the compilation of algorithms on reconfigurable hardware to reduce the time required to execute a program on the hardware.

2. Relevant Background

As microprocessors continue to increase rapidly in processing power, they are used more often to do computationally intensive calculations that were once exclusively done by supercomputers. However, there are still computationally intensive tasks, including compute-intensive image processing and hydrodynamic simulations that can take significant amounts of time to execute on modern microprocessors.

Paralleling the progress of microprocessors, reconfigurable hardware such as field programmable gate arrays (FPGAs) has made advances both in terms of increased circuit density as well as ease of reprogramming, among other areas. Originally developed as simple logic for interconnecting components on digital systems, reconfigurable hardware has become so easy to reprogram that it can be used today as reconfigurable logic for executing a program.

A number of advantages may be realized when the reconfigurable hardware can be reprogrammed to meet the needs of individual programs. For example, the reconfigurable hardware may be programmed with a logic configuration that has more parallelism and pipelining characteristics than a conventional microprocessor. Also, the reconfigurable hardware may be programmed with a custom logic configuration that is very efficient for executing the tasks assigned by the program. Furthermore, dividing a program's processing requirements between the microprocessor and the reconfigurable hardware may increase the overall processing power of the computer.

Unfortunately, an important stumbling block for users who may wish to take advantage of reconfigurable hardware is the difficulty of programming the hardware. Conventional methods of programming reconfigurable hardware included the use of hardware description languages (HDLs); low-level languages that require digital circuit expertise as well as explicit handling of timing.

Progress has been made in the development of technology for compiling conventional high-level languages to reconfigurable hardware. However, existing compilers that compile the algorithms written in these high-level languages still benefit from optimization to get the reconfigurable hardware to process data in the most efficient way possible.

One performance limit comes from the time required when reconfigurable hardware reads data elements from a source array in memory located outside the hardware. This limit is observed when, for example, a compute-intensive algorithm consists of loops that operate over a multi-dimensional source array located outside the reconfigurable hardware, where each iteration of a loop computes on a rectangular sub-array or stencil of the source array.

For example, in a conventional windowed loop the elements of the source array are stored in a memory external to the reconfigurable hardware and are accessed by the hardware at a rate of one cell value per clock cycle. Thus, when the windowed array is a 3×3, two-dimensional array, nine clock cycles are needed to read the nine values of the array into the reconfigurable hardware. If the source array is a two-dimensional array of size $S_i \times S_j$, and the windowed array is size $W_i \times W_j$, then the number of clock cycles needed to run the loop may be represented as:

$$(S_i-(W_i-1)) \times (S_j-(W_j-1)) \times (W_i \times W_j) + L$$

where L is the pipeline depth of the loop.

Accordingly, significant efficiencies can be realized by reducing the number of times that a data element from outside the reconfigurable hardware has to be reread into the hardware. Moreover, efficiencies can be realized by eliminating intermediate steps in processing the data that involve writing data to memory outside the reconfigurable processor and later reading the data back into the hardware.

SUMMARY OF THE INVENTION

Accordingly, an embodiment of the invention includes a method of computing a function array in reconfigurable hardware comprising forming in the reconfigurable hardware a first delay queue and a second delay queue, inputting from a source array outside the reconfigurable hardware a first value into the first delay queue and a second value into the second delay queue, defining in the reconfigurable hardware a window array comprising a first cell and a second cell, inputting the first value from the first delay queue into the first cell and the second value from the second delay queue into the second cell, and calculating an output value for the function array based on the window array.

Another embodiment of the invention includes A method of loop stripmining comprising forming in reconfigurable hardware a first delay queue with a first length equal to a maximum number of values stored in the delay queue, forming a sub-array from a first portion of a source array, wherein at least one dimension the sub-array has a size equal to the first length of the first delay queue, loading values from the first sub-array into the first delay queue; and stepping the sub-array to a second portion of the source array.

Another embodiment of the invention includes a method of calculating output values in a fused producer/consumer loop structure comprising forming in a reconfigurable hardware a first delay queue and a second delay queue, loading a first output value from a producer function into the first delay queue, loading a second output value from the producer function and loading into the first delay queue, wherein the first output value is loaded into the second delay queue, and inputting the first output value from the second delay queue, the second output value from the first delay queue, and a third output value from the producer function into a consumer function to calculate a consumer output value.

DETAILED DESCRIPTION OF THE PREFERRED EMBODIMENTS

Figure 1:
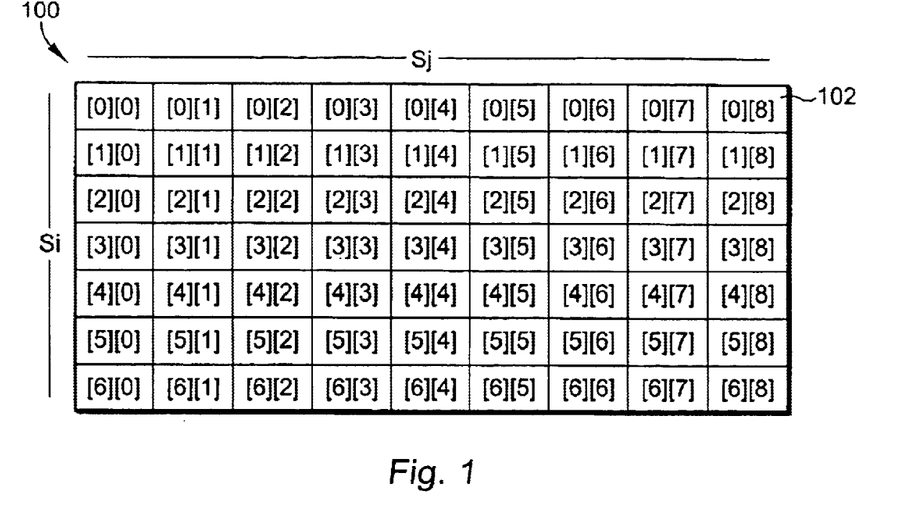
FIG. 1 shows an example of a two-dimensional source array that may be used with the present invention.

FIG. 1 shows an example of a two-dimensional source array 100 that may be used with the present invention. In one embodiment, the size of source array 100 may be represented as $S_i \times S_j$, where Si represents the number of rows in the two-dimensional array and $S_j$ represents the number of columns. An address for each cell 102 of source array 100 may be represented by $S_{ij}$ where i represents a row number and j represents a column number. For example, the upper-leftmost corner cell 102 of source array 100 may be represented by $S_{00}$.

While source array 100, a small two-dimensional array, is described here for the sake of simplicity, embodiments of the invention also include more complex arrays having three or more dimensions. In addition, embodiments of the invention also include two-dimensional source arrays with a greater number of cells 102 and where the number of columns and rows may or may not be equal (i.e., the width and depth of the source array may or may not have equal lengths).

Figure 2:
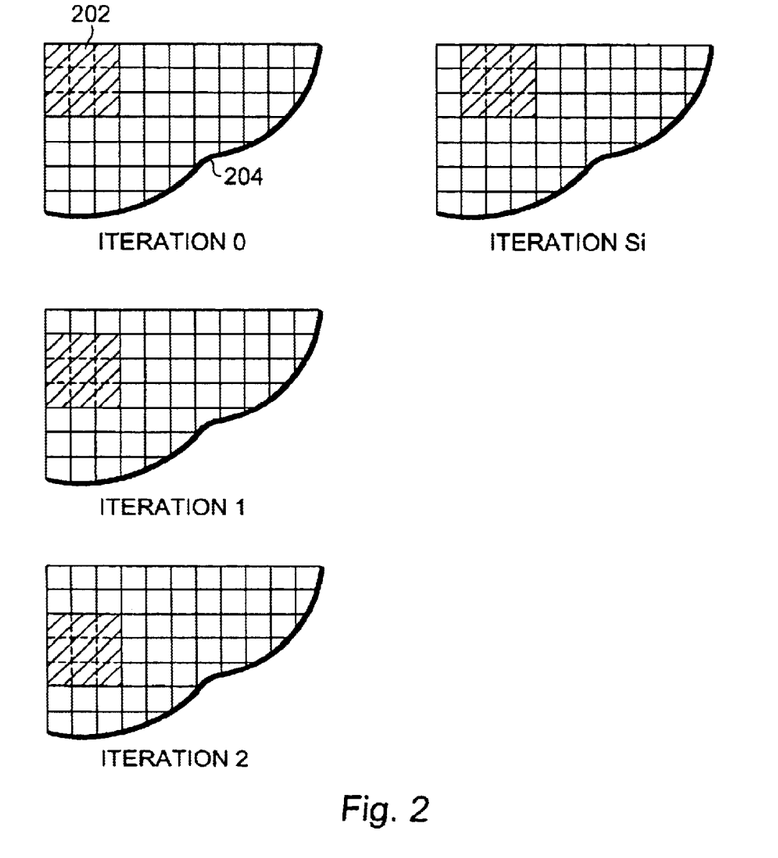
FIG. 2 shows iterations of a window array across a portion of a source array according to an example of the present invention.

Referring now to FIG. 2, iterations of a window array 202 across a portion of a source array 204 according to an example of the present invention is shown. A two-dimensional window array 202 with dimensions $W_i \times W_j$ (3×3 in the example shown) may overlap a portion of source array 204. The window array 202 defines a portion of source array 204 that may be operated upon by the reconfigurable hardware. For example, window array 202 may select a portion of source array 204 that is processed by a median filter function that calculates a median value of the elements in window array 202. In another example, an average value of the elements in window array 202 may be calculated.

As shown in FIG. 2, successive iterations of a windowed loop may step window array 202 down the columns of source array 204. In this example, the window array 202 may move vertically down the rows of the source array 204, stepping one row per iteration. When the window array 202 reaches the last row of the source array 204 the window array 202 may move horizontally by one column and back up to the top row of the source array 204. The loop may repeat this down row/across column pattern for the entire source array 204.

An example of a windowed loop nest that makes use of a window array 202 that overlaps a source array 204 may be represented in computer code by:

```
Dj = Wj-1;     // Wj is the window width
Di = Wi-1;     // Wi is the window height
for  (j=0; j<Sj-Dj; j++)
    for (i=0; i<Si-Di; i++) {
    a00 = A[i] [j];    a01 = A[i] [j+1];   a02 = A[i] [j+2]
    a10 = A[i+1] [j];  a11 = A[i+1] [j+1]; a12 = A[i+1] [j+2]
    a20 = A[i+2] [j];  a21 = A[i+2] [j+1]; a22 = A[i+2] [j+2]
    rval = F (a00, a01, a02,
        a10, a11, a12,
        a20, a21, a22);
    B[i] [i] = rval; }
```

In the example computer code shown above, F represents a computation using the nine values from the nine cells of the window array 202 (referred to as "A" in the computer code) and may be implemented as a function call. The definition of function F may be specific to the algorithm being implemented. For example, F may represent a function for image processing including, but not limited to, edge detection, median filter, erode and dilate. The resultant calculations of F may be stored in a result array, B (not shown). As shown in this example, the vertical iterations of window array 202 may span the full depth of the source array 204.

While FIG. 2 and the example computer code shows window array 202, as a 3×3 array, the size of the window array may vary in both dimensions and may not be square. In some instances, the size of the window array may be fixed by the algorithm that is executed on the reconfigurable hardware. For example, the function F above may fix the size of window array 202 to a 3×3 array. Also, while this example shows all nine cells of window array 202 being used by the function, F, there is also contemplated loop stenciling of source array 204 where fewer than all the window array cells are used by a function.

Figure 3A:
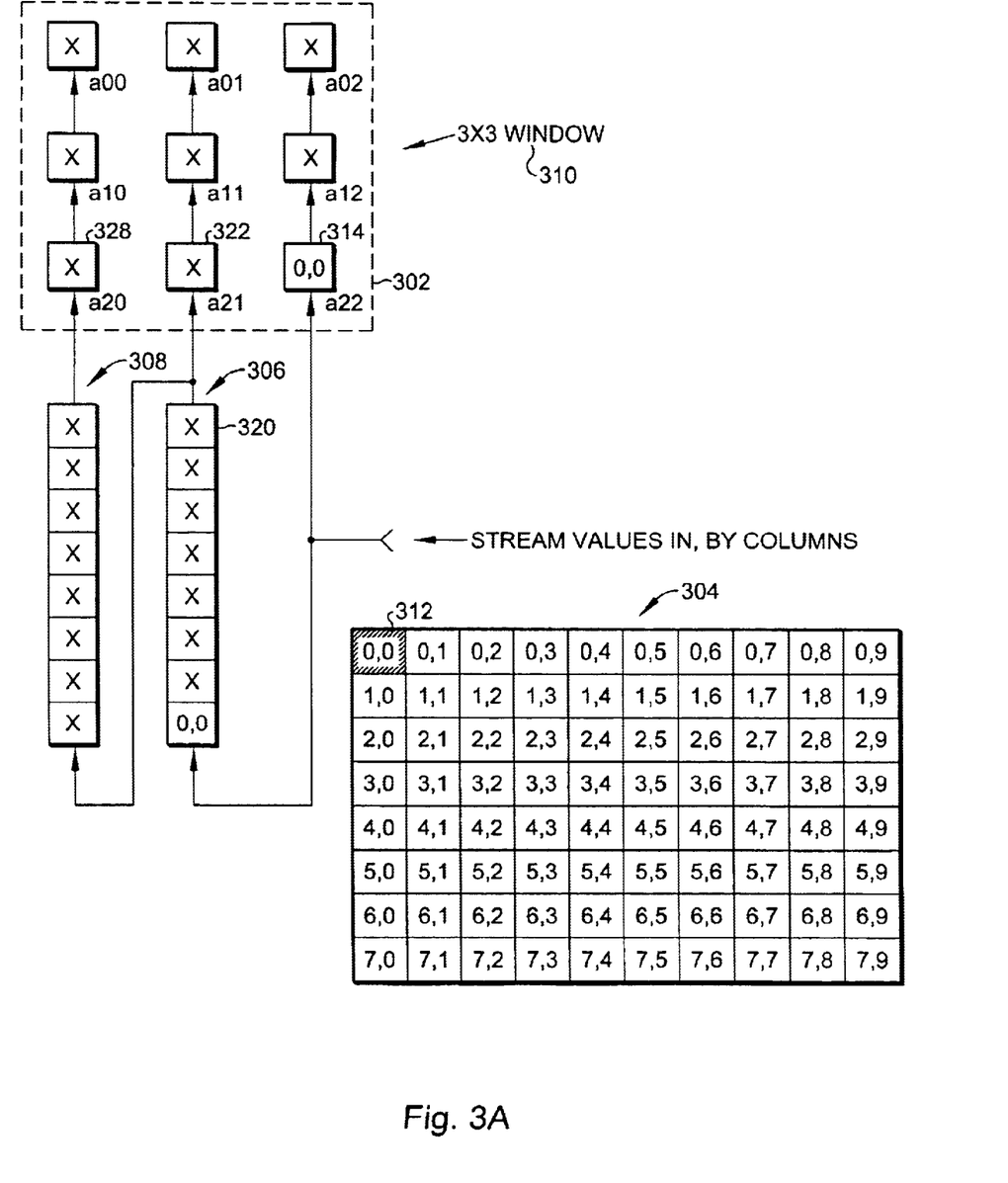
FIGS. 3A–F show values from a source array loaded into delay queues and a windowed array in reconfigurable hardware according to an embodiment of the invention.

Referring now to FIG. 3A, an output value from a source array 304 loaded into a first delay queue 306 and a 3×3 window array 302 in reconfigurable hardware 310 according to an embodiment of the invention is shown. In an embodiment, the memory of the reconfigurable hardware 310 comprises first delay queue 306, a second delay queue 308. The two delay queues 306 and 308 may be the same length (i.e., hold the same number of data values) and may comprise First In First Out (FIFO) buffers. In this embodiment, data values from source array 304 may be read from outside memory of the reconfigurable hardware 310 and stored in the delay queues 306 and 308 in order to reduce the number of times that each value of source array 304 needs to be reread into the reconfigurable hardware.

Figure 3B:
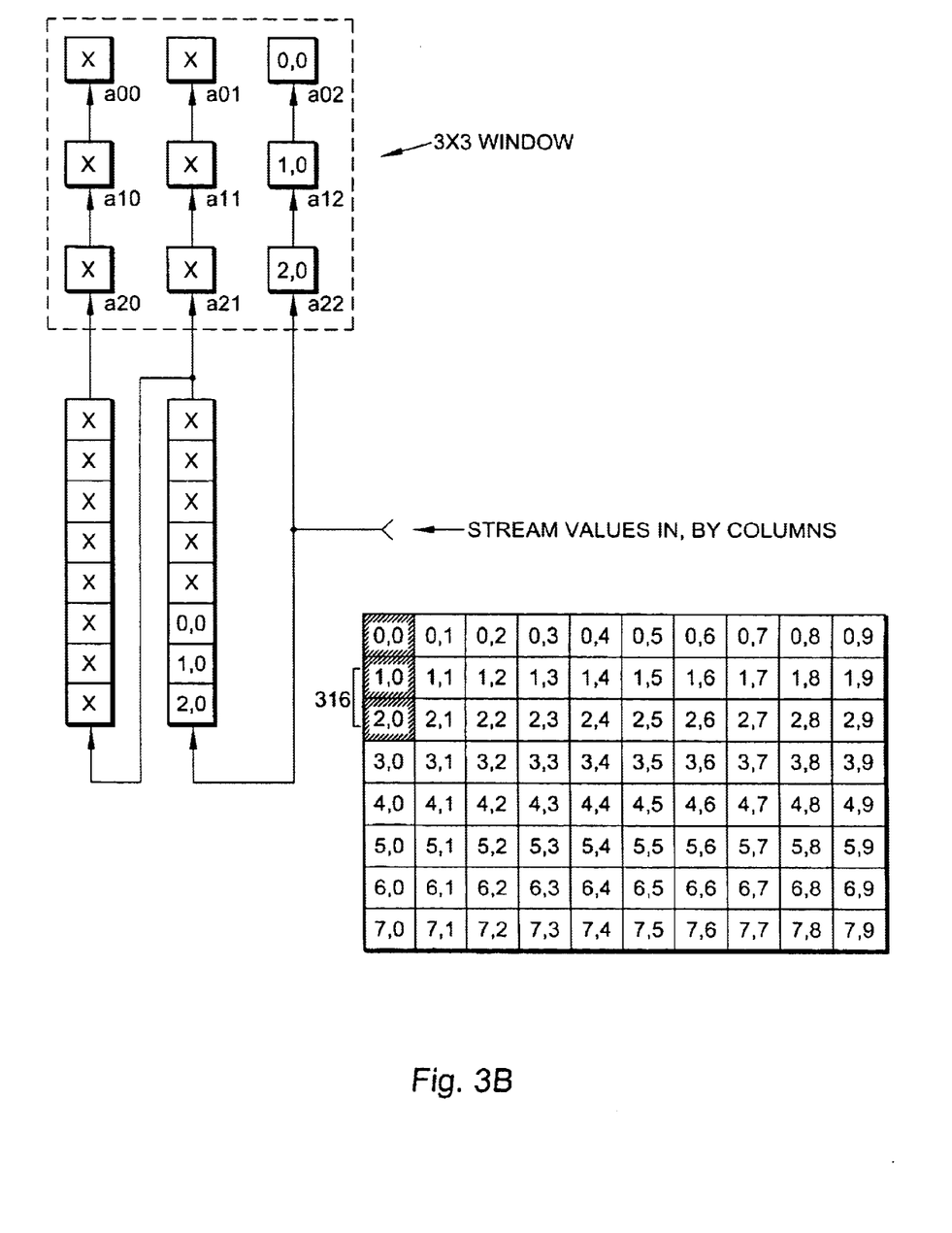

As shown in FIG. 3A, a first value 312 of source array 304 may be read into array cell 314 of window array 302 and first delay queue 306. In the next iteration that is illustrated by FIG. 3B, two more values 316 from the first column of source array 304 are read into window array 302 and first delay queue 306. When each of the values 314 are read into array cell 320, the previous value occupying the cell may be pushed up the column of window array 302.

Figure 3C:
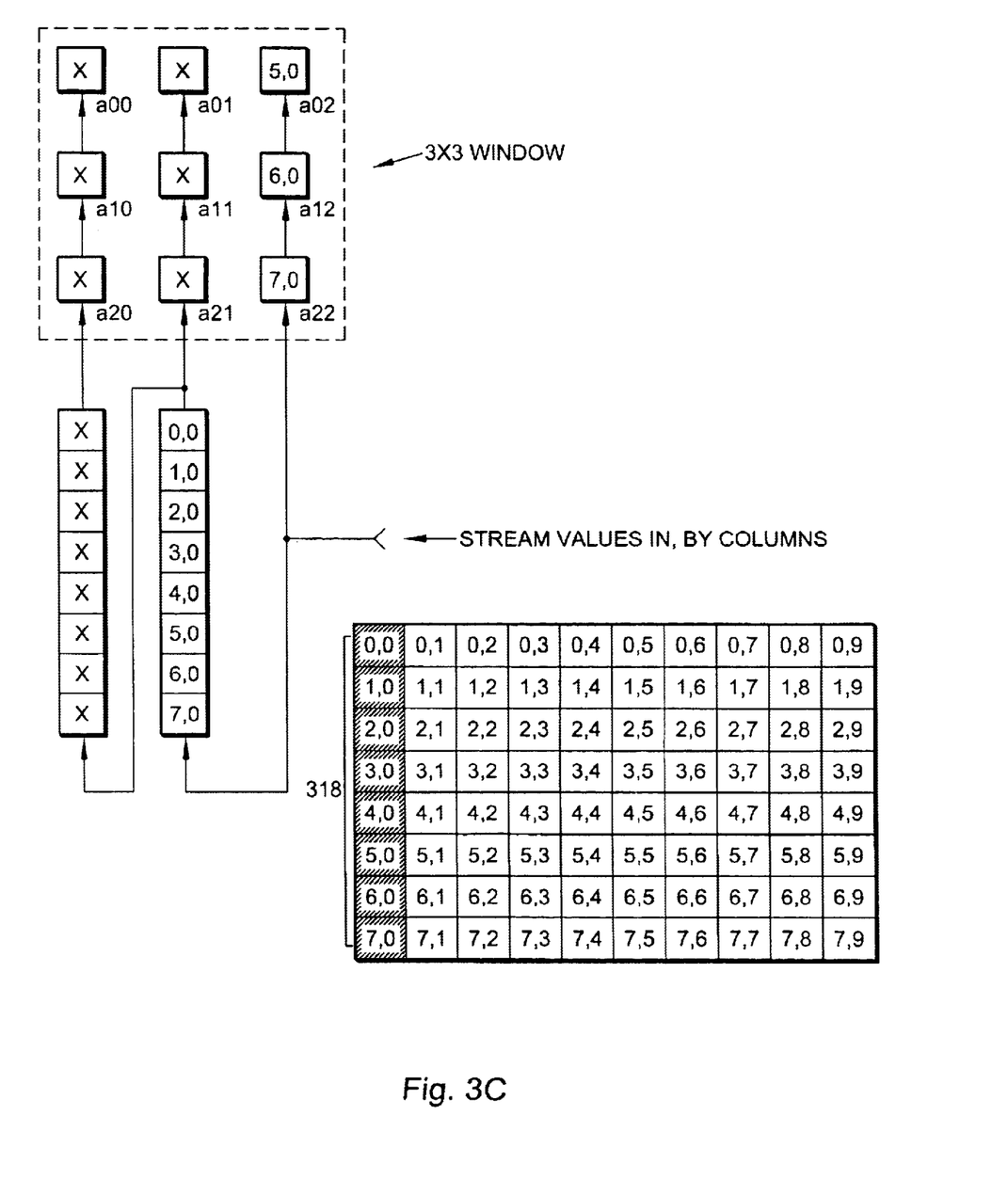

As illustrated by FIG. 3C, the first delay queue 306 may fill to capacity when the last value in the left column 318 of source array 304 is read into the delay queue 306 and the window array 302. In an embodiment, the oldest value 320 may also be read into array cell 322 of the middle column of window array 302 when a new value is read into first delay queue 306. In another embodiment, the oldest value 320 of first delay queue 306 may be transferred to the second delay queue 308 when a new value is read into first delay queue 306.

Figure 3D:
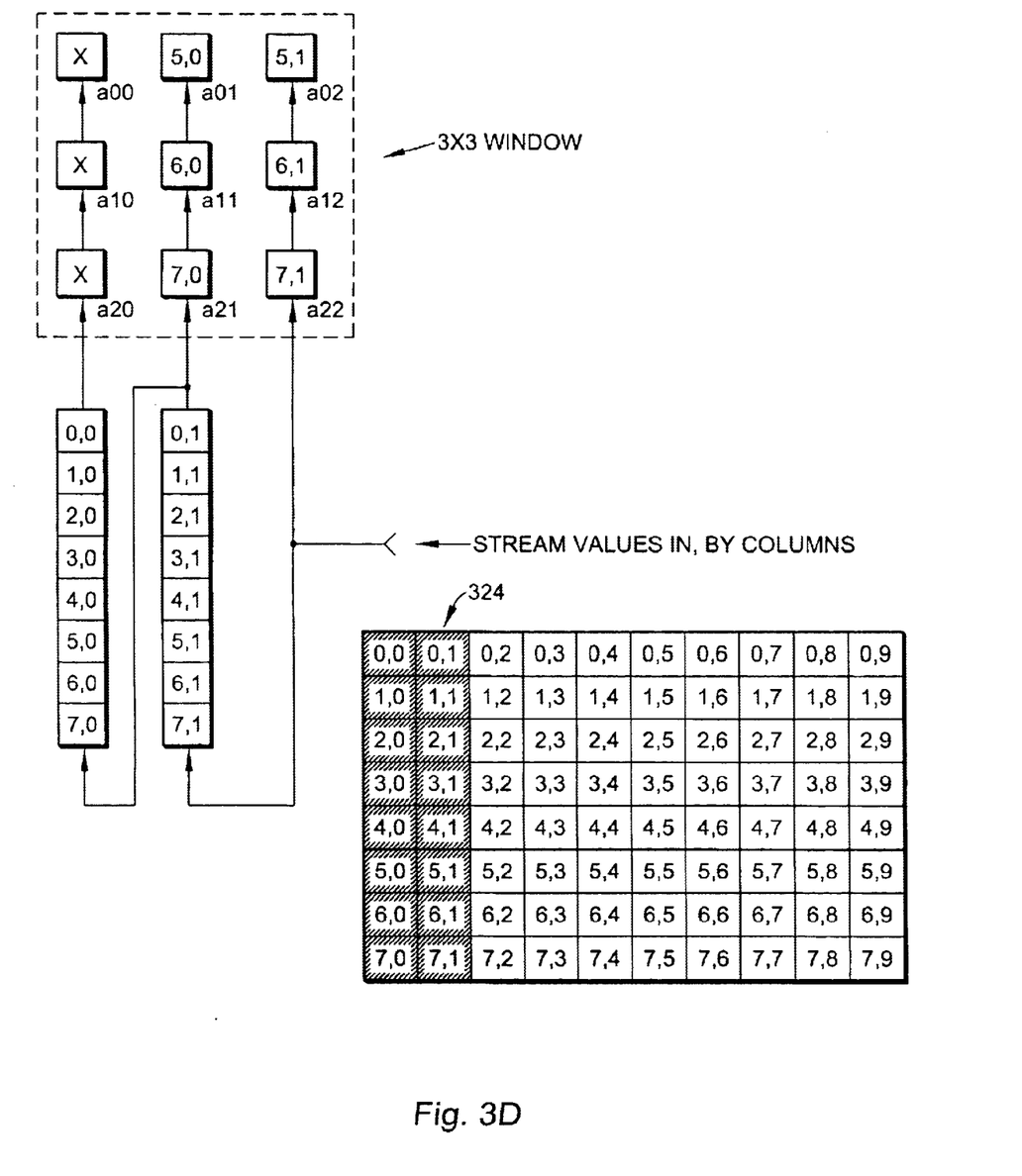

Referring now to FIG. 3D, a second column 324 from source array 304 has been read into reconfigurable hardware 310. In an embodiment, the oldest value from first delay queue 306 may be read into window array 302 and second delay queue 308 for each new value read into first delay queue 306 from source array 304. In this embodiment, when the values from the second column of source array 304 fills into first delay queue 306, second delay queue 308 may fill with the values from the first column of source array 304. Also, as the values are transferred from first delay queue 306 to second delay queue 308, they may also be written to array cell 322. Also, the newest values read from source array 304 may be input into array cell 314 of window array 302 as they are input into first delay queue 306.

Figure 3E:
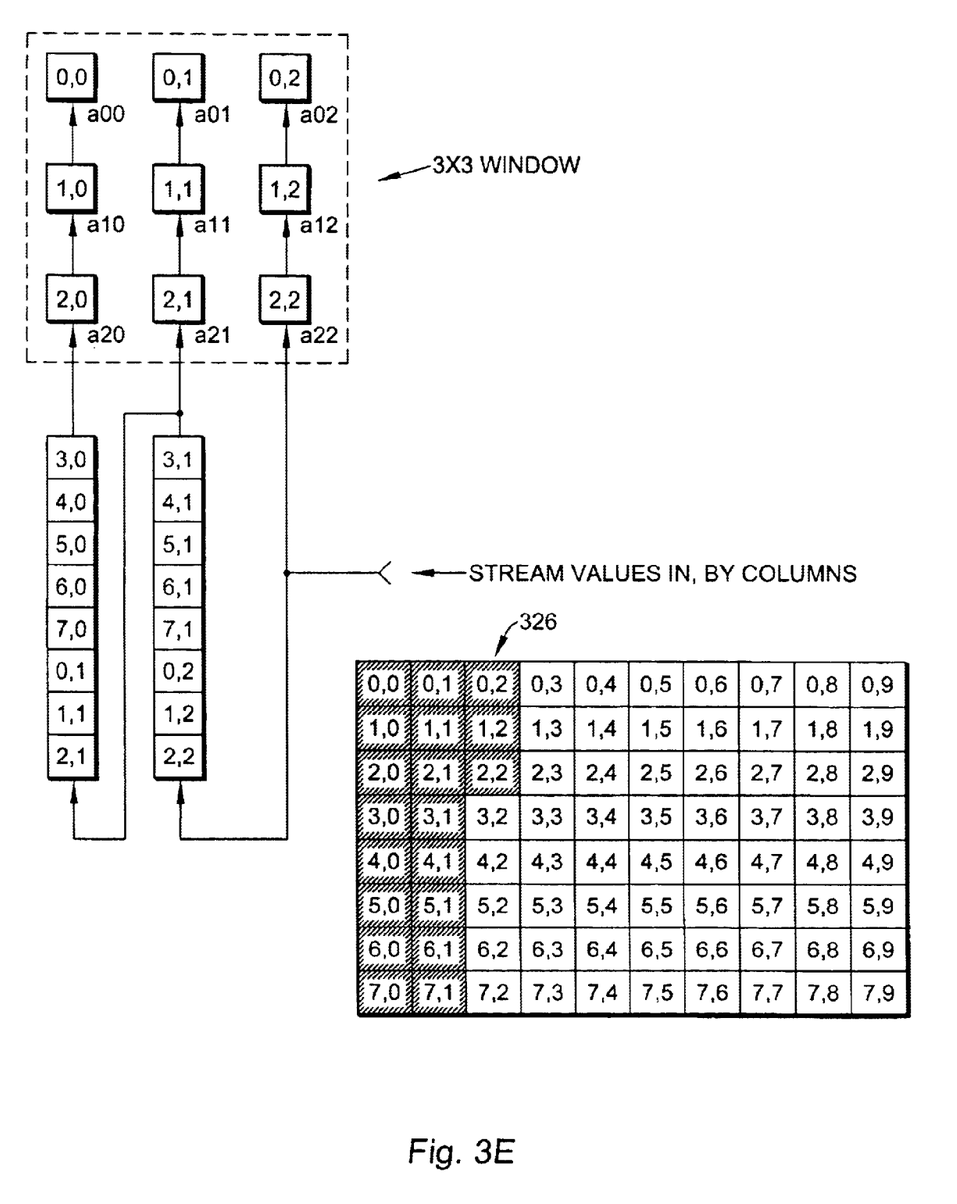

Referring now to FIG. 3E three values 326 from the third column of source array 304 are input into reconfigurable hardware 310. As each of these values 326 are input into first delay queue 306, the oldest values 320 from the first delay queue are input into second delay queue 308, which in turn may push the oldest values from the second delay queue 308 into array cell 328 of the left column of window array 302. The net effect of these transfers after all three values 326 are input into the reconfigurable hardware 310 may be that the nine values in window array 302 may match the nine values in the 3×3 sub-array of source array 304.

Figure 3F:
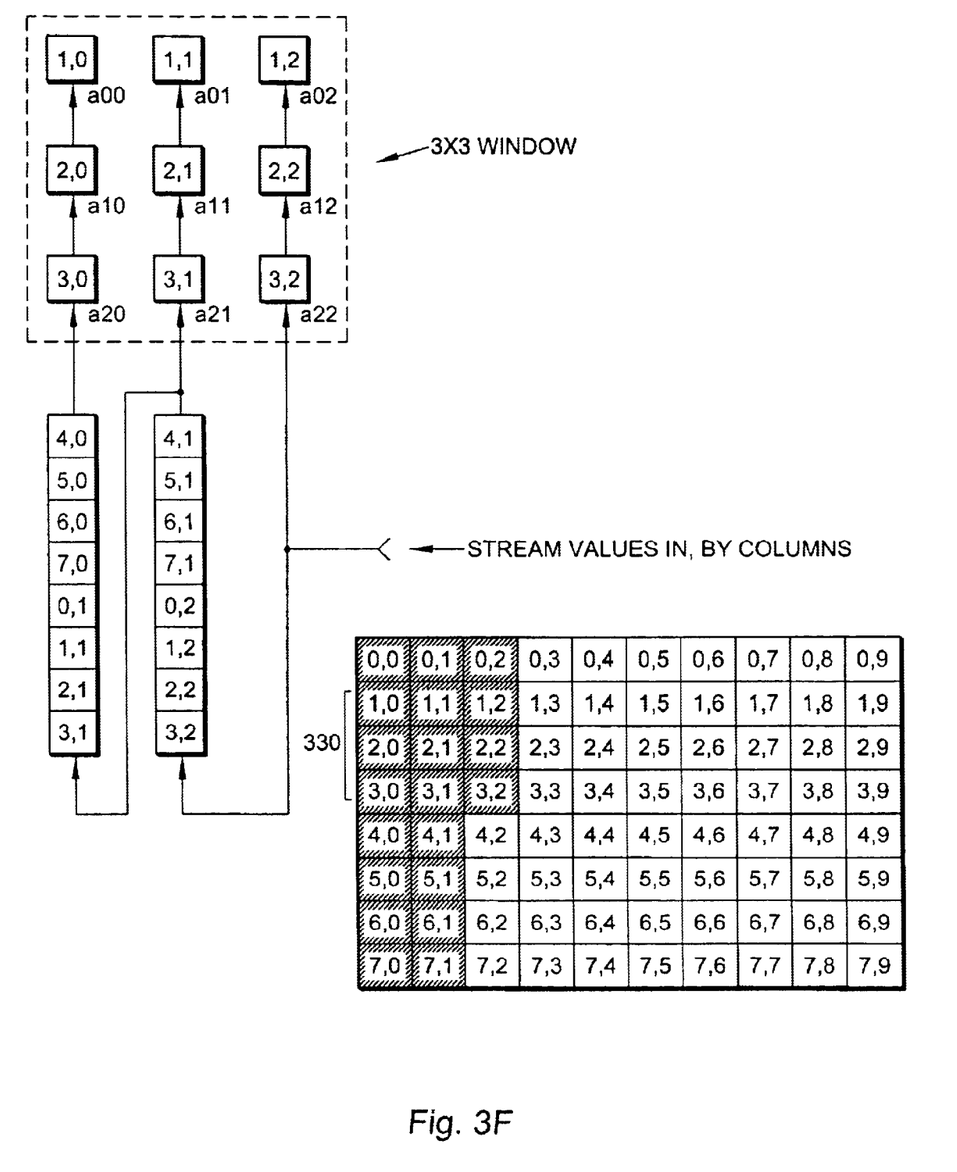

As the next value is read from the third column of source array 304, as shown in FIG. 3F, this value replaces element 314 of the window array 302. In addition, the oldest value in first delay queue 306 and the oldest value in second delay queue 308 replace elements 322 and 328, respectively, of the window array 302. The values in window array 302 may now be the same as sub-array 330 of source array 304, which is similar to incrementing a window array vertically down the rows of source array 304.

As noted above, delay queues 306 and 308 may eliminate the need to reread values into the reconfigurable hardware as window array 302 moves vertically down the rows of source array 304. When window array 302 starts a new cycle at the top row of source array 304, first delay queue 306 may be empty or loaded with "junk" values. As shown in FIGS. 3A–C, "dummy iterations" may be needed to load first delay queue 306 with correct values. In one embodiment, the dummy iterations may be accounted for in the computer code by starting the inner loop induction value (represented by i in the code above) at −2 instead of 0. In this embodiment, the first two iterations may compute nonsense values for the function F, and these may be discarded by placing a conditional on writes to the results array, B.

In another embodiment, the rereading of source array 304 values into the configuration hardware may be eliminated as the window array 302 moves horizontally across the columns of source array 304. As noted above, with each downward pass of the inner loop, one new column of data may be read from source array 304. The remaining columns, however, were read in previous iteration of the outer loop, and may be stored in delay queues 306 and 308 in the reconfigurable hardware to eliminate the need to reread them. In one embodiment, the windowed loop computer code may be modified to look like:

```
Di = Wi-1;
Dj = Wj-1;
for (k=0; k<Sj-Dj; k+=DEPTH-Di) {
    st = k;
    if (st + DEPTH > Si)
        st = Si - DEPTH;
    for (j=-Dj; j<Sj-Dj; j++)
        for (i=st-Di; i<st+DEPTH-Di; i++) {
            aval = A[i+Dj] [j+Dj]
            a00 = a01;   a01 = a11;   a02 = a12
            a10 = a20;   a11 = a21;   a12 = a22
            a22 = aval;
            a21 = delay (&dly2, a22);
            a20 = delay (&dly1, a21);
            rval = F (a00, a01, a02,
                      a10, a11, a12,
                      a20, a21, a22);
            if ((i >= st) && (j >=0)
                B[i] [j] = rval; } }
```

In this embodiment of the code, the value of A[i+2][j] may be the same value that was read as A[i+2][j+1] in the previous iteration of the outer loop, and A[i+2][j+1] may be the same value that was read as A[i+2][j+2]. The previously read values are stored in delay queues in the reconfigurable hardware.

Figure 4:
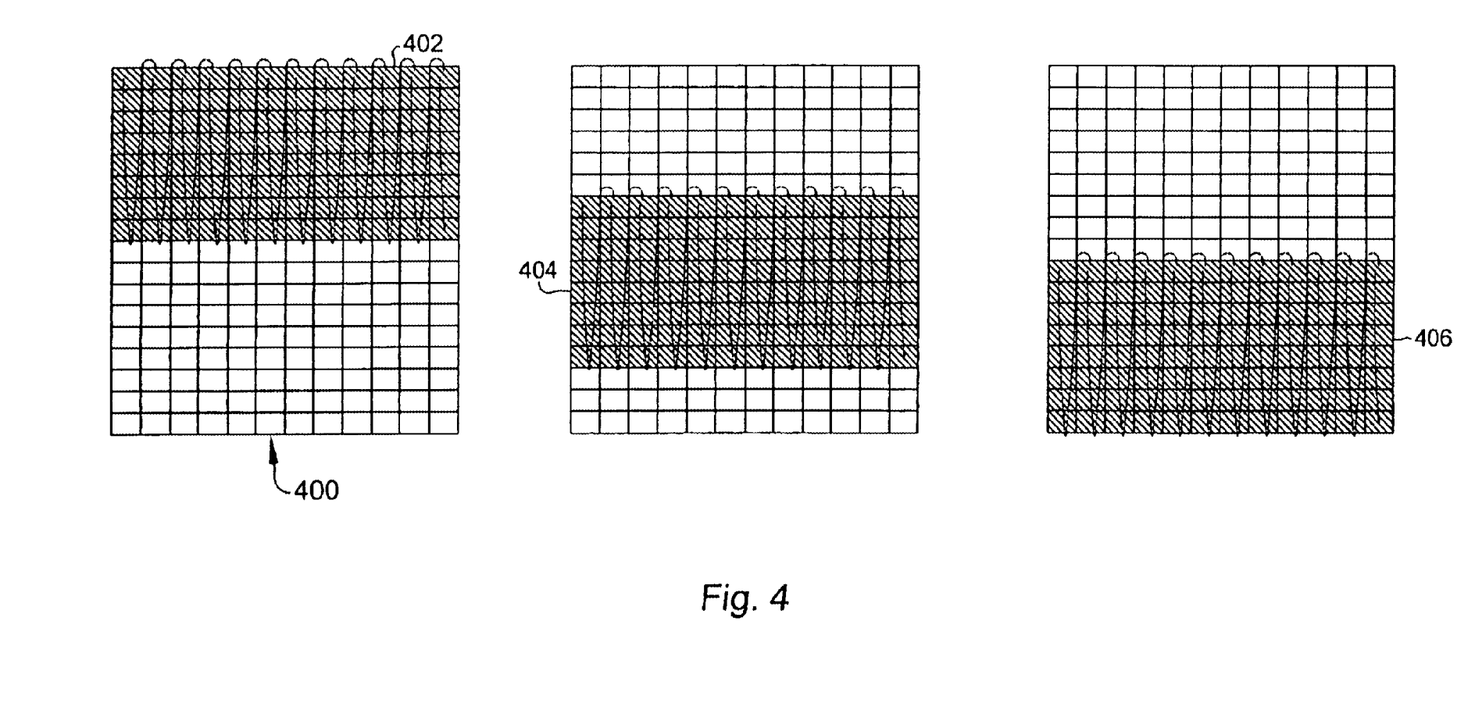
FIG. 4 shows an example of loop stripmining in a source array according to an example of the present invention.

The variable DEPTH in the above code represents the height of the portion of the source array being processed during an iteration of the outer loop. In one embodiment, the value of DEPTH may span the entire height of the source array, $S_j$. In another embodiment, loop stripmining may be employed to process the full source array as two or more sub-arrays or data blocks. In this embodiment, DEPTH may have a value less than the height of the height of the source array $S_j$. In still another embodiment, DEPTH may be made a power of two in order to simplify divide and mod operations to compute the array indices as simple shifts and masks:

FIG. 4 shows a source array 400 that is processed in sections in the reconfigurable hardware with loop stripmining. In an embodiment of this method, a first sub-array 402 may have a width equal to the width of the source array and height equal to DEPTH, where, in this embodiment, DEPTH is equal to the length of a delay queue in the reconfigurable hardware. In the first iteration of the outer loop, first sub-array 402 defines the portion of source array 400 that may be processed by successive iterations of the inner loop where a windowed array moves down the rows and across the columns of first sub-array 402. During the iterations of the inner loop, each value from the source array may be read into the reconfigurable hardware and stored in a delay queue by calling the delay function with a function call. When each new source array value is written into the delay queue the oldest value in the delay queue may be output from the tail of the delay queue and as the function call's return. In another embodiment, the inner loops produce dummy iterations, and the write to the result array, B, may include conditional statements to ignore the results of these iterations.

In the second iteration of the outer loop, second sub-array 404 may have the same width and height as first sub-array 402, but is positioned further down on source array 400. In the embodiment shown, two rows of the first sub-array 402 overlap with two rows of second sub-array 404. In another embodiment, one or more rows of a sub-array may overlap another sub-array. In still another embodiment, no cells of the sub-arrays overlap each other.

In the third iteration of the outer loop, the bottom of third sub-array 406 may be aligned with the bottom of source array 400. In the last iteration of the outer loop, more rows of the source array may be recalculated than for previous iterations as a result of the bottom edge of the last sub-array being aligned with the bottom of the source array.

In an embodiment, the storage array is a two-dimensional, rectangular array stored in row-major order, and stored contiguously in memory. Data movement calls to the source array may be included inside the outer loop to read data from the source array into the reconfigurable hardware, process it, and write the resultant array to outside memory. In another embodiment, data movement calls may be configured for the simultaneous moving one data set while another data set is being processed in the reconfigurable hardware.

Figure 5:
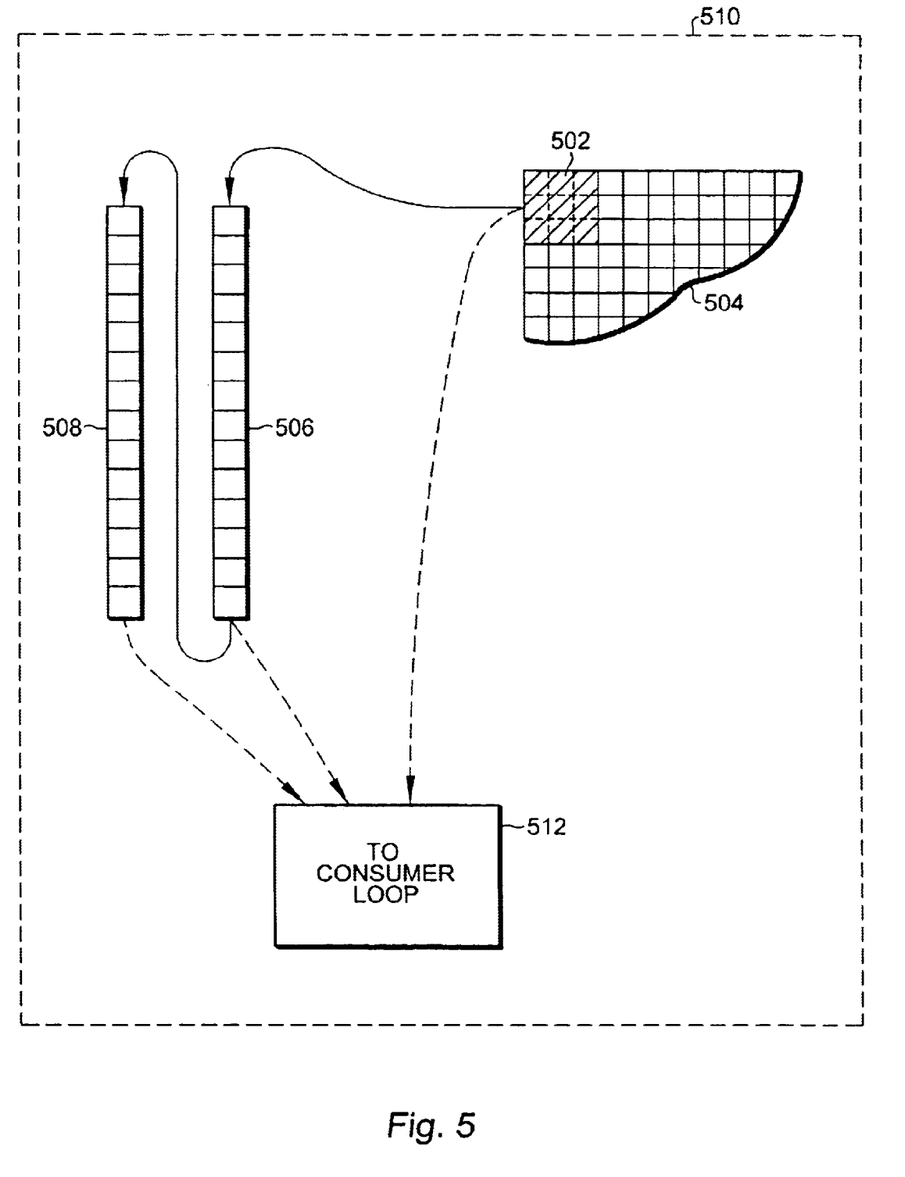
FIG. 5 shows an example of data flow in reconfigurable hardware where loop fusion couples output data between a producer loop and a consumer loop.

Referring now to FIG. 5, an embodiment of the invention is shown of data flow in reconfigurable hardware 510 where loop fusion couples output data between a producer loop and a consumer loop. In an embodiment, multiple window loops may be connected in the reconfigurable hardware with producer-consumer loop fusion methods. These methods include the elimination of intermediate arrays as an output from one nested loop structure, the producer loop, is directly connected to the input of another nested loop, the consumer loop. In this embodiment, the elimination of the intermediate loop reduces the number of reads to reconfigurable hardware 510 thereby reducing processing time.

An embodiment of the invention includes a method of calculating output values with a fused producer/consumer loop structure in reconfigurable hardware 510 such as a FPGA. For example, a calculation may involve applying a first function to nine values of a source array 504, defined by window array 502, to produce a single output value, followed by a second function that may be applied to nine output values from the first function. As noted above, in a conventional loop structure where the first and second function loops are not fused, the first function loop fills an intermediate array with the output values and the second function loop processes this intermediate array. By fusing together the first and second function loops into a producer/consumer loop structure, the intermediate array may be eliminated.

The fused producer/consumer loop structure method may start with the formation a first delay queue 506 and second delay queue 508 in the reconfigurable hardware 510. In an embodiment, the first and second delay queue 506 and 508 may be the same length and may be FIFO buffers.

In another embodiment, a producer function that is part of a producer loop may be applied to source array 504 values read into the reconfigurable hardware in order to calculate producer output values. For example, in successive loop iterations the producer function (which correspond to the row by row steps of window array 502) may be applied to successive sets of source array values and calculate successive output values. The output values may be loaded into first delay queue 506 as they are produced by the producer function. In one embodiment, when first delay queue 506 reaches the maximum number of output values it can hold, a previously loaded output value may be transferred from first delay queue 506 to second delay queue 508 for each additional output value loaded into first delay queue 506 from the producer function.

For example, a first output value may be loaded into first delay queue 506 followed by successive output values until first delay queue 506 is filled. Then, as the next output value is loaded into first delay queue 506, the first output value may be transferred from first delay queue 506 to the second delay queue 508.

The consumer function that is part of the consumer loop 512 may be applied to the output values from the producer function to calculate a consumer output value. In one embodiment, for each iteration of the consumer loop 512 the consumer function may be applied to a first output value from second delay queue 508, a second output value from first delay queue 506, and a third output value coming directly from a calculation by the producer function on window array 502.

In another embodiment based on the example above where the consumer function is applied to an windowed array of 9 output values, each three value row of the array may be supplied, respectively, by output values from second delay queue 508, the first delay queue 506 and directly from the producer function operating on window array 502. When three of these rows stack vertically, a 3×3 array of output values may be formed for the consumer function.

In another embodiment, the length of delay queues 506 and 508 may be equal to the depth of the source array. In another embodiment where loop stripmining may be employed, the length of a delay queue may be equal to the depth of the sub-array. In these embodiments, as the producer loop iterates down the column of source array 504 or sub-array of source array 504, the delay queues 506 and 508 filling with output values may be analogous to the columns of an intermediate array of output values. For example, when an consumer function is applied to a three-column, window array of output values from the producer function, the left column of the window array may be aligned with the first delay queue, the middle column may be aligned with the second delay queue, and the right column may be aligned with the sequence of output values produced as the first and second delay queues are being filled and/or refreshed.

In another embodiment output values from the producer function may be supplied to the consumer loop and loaded into first delay queue 506 in the same producer loop iteration. In another embodiment, an output value transferred from first delay queue 506 to second delay queue 508 may also be supplied to the consumer loop in the same producer loop iteration. In still another embodiment, an output value may be written outside reconfigurable hardware 510 from a final delay queue and supplied to the consumer in the same producer loop iteration.

An example of how loop fusion may be implemented in computer code may start with a pair of loops prior to loop fusion such as:

```
Di = Wi-1;
Dj = Wj-1;
for (k=0; k<Sj-Dj; k+=DEPTH-Di) {
    st = k;
    if (st + DEPTH > Si)
        st = Si - DEPTH;
    for (j=-Dj; j<Sj-Dj; j++)
        for (i=st-Di; i<st+DEPTH-Di; i++) {
            aval = A[i+Dj] [j+Dj]
            a00 = a01;   a01 = a11;   a02 = a12
            a10 = a20;   a11 = a21;   a12 = a22
            a22 = aval;
            a21 = delay (&dly2, a22);
            a20 = delay (&dly1, a21);
            rval = F1 (a00, a01, a02,
                       a10, a11, a12,
                       a20, a21, a22);
            if ((i >= st) && (j >=0))
                B[i] [j] = rval; } }
Ei = Vi-1;
Ej = Vj-1;
for (k=0; k<(Sj-Dj)-Ei; k+=DEPTH-Ei) {
    st = k;
    if (st + DEPTH > (Si-Di))
        st = (Si-Di) - DEPTH;
    for (j=-Ej; j<(Sj-Dj)-Ei; j++)
        for (i=st-Ei; i<st+DEPTH-Ei; i++) {
            bval = B[i+Ej] [j+Ej]
            b00 = b01;   b01 = b11;   b02 = b12
            b10 = b20;   b11 = b21;   b12 = b22
            b22 = bval;
            b21 = delay (&dly2, b22);
            b20 = delay (&dly1, b21);
            rval = F2 (b00, b01, b02,
                       b10, b11, b12,
                       b20, b21, b22);
            if ((i >= st) && (j >=0))
                C[i] [j] = rval; } }
```

In this example, the second loop nest uses values from results array B, whose values are based on computations of function, F1. Also, the two loops in the code above reuse some previously read values which may eliminate the need to reread those values from outside the reconfigurable hardware. In one embodiment, the two nested loops may be fused together so that the second nested loop may read a stream of values from results array B in the same order that the first nested loop produced those values.

In an embodiment where loop fusion is combined with the example of loop stripmining shown in FIG. 4, there may be overlap between the sub-arrays 402. In this embodiment, the second loop nest may overlap by two rows due to the two-row overlap at the boundary of the first sub-array 402 and the second sub-array 404. This overlap may be compensated for by modifying the first nested loop such that it produces the values in the overlap rows twice which produces the values in the proper sequence in the second nested loop. Once this modification is made, the two loops may be fused by feeding the function values, F1, from the first nested loop into a delay queue that that may be read out by the second nested loop. An example of the computer code for the fused loops may be described as:

```
Di = (Wi-1) + (Vi-1);
Dj = (Wj-1) + (Vj-1);
for (k=0; k<Sj-Dj; k+=DEPTH-Di) {
    st = k;
    if (st + DEPTH > Si)
        st = Si - DEPTH;
    for (j=-Dj; j<Sj-Dj; j++)
        for (i=st-Di; i<st+DEPTH-Di; i++) {
            aval = A[i+Dj] [j+Dj];
            a00 = a01;   a01 = a11;   a02 = a12
            a10 = a20;   a11 = a21;   a12 = a22
            a22 = aval;
            a21 = delay (&dly2, a22);
            a20 = delay (&dly1, a21);
            bval = F1 (a00, a01, a02,
                       a10, a11, a12,
                       a20, a21, a22);
            b00 = b01;   b01 = b11;   b02 = b12
            b10 = b20;   b11 = b21;   b12 = b22
            b22 = bval;
            b21 = delay (&dly4, b22);
            b20 = delay (&dly3, b21);
            rval = F2 (b00, b01, b02,
                       b10, b11, b12,
                       b20, b21, b22);
            if ((i >= st) && (j >=0))
                B[i] [j] = rval; } }
```

In another embodiment, this technique may be extended to fuse any number of loop nests.

In still another embodiment, the individual nested loops may be combined into a single loop. Example code of the pair of nested loops above combined to form a single loop may look like:

```
Di = (Wi-1) + (Vi-1);
Dj = (Wj-1) + (Vj-1);
for (k=0; k<Sj-Dj; k+=DEPTH-Di) {
    st = k;
    if (st + DEPTH > Si)
        st = Si - DEPTH;
    for (xs=0; xs<Sj*DEPTH; xs++) {
        j = xs/DEPTH - Dj;
        I = xs%DEPTH + st - Di;
        aval = A[i+Dj] [j+Dj];
        a00 = a01;   a01 = a11;   a02 = a12
        a10 = a20;   a11 = a21;   a12 = a22
        a22 = aval;
        a21 = delay (&dly2, a22);
        a20 = delay (&dly1, a21);
        bval = F1 (a00, a01, a02,
                   a10, a11, a12,
                   a20, a21, a22);
        b00 = b01;   b01 = b11;   b02 = b12
        b10 = b20;   b11 = b21;   b12 = b22
        b22 = bval;
        b21 = delay (&dly4, b22);
        b20 = delay (&dly3, b21);
```

-continued

```
        rval = F2 (b00, b01, b02,
                   b10, b11, b12,
                   b20, b21, b22);
        if ((i >= st) && (j >=0))
            B[i] [j] = rval; } }
```

In an embodiment, the loop combing method above may be pipelined in the reconfigurable hardware to reduce the start-up overhead in the inner loop.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

The words "comprise," "comprising," "include," "including," and "includes" when used in this specification and in the following claims are intended to specify the presence of stated features, integers, components, or steps, but they do not preclude the presence or addition of one or more other features, integers, components, steps, or groups.

I claim:

1. A method of computing a function array in reconfigurable hardware comprising:

forming in the reconfigurable hardware, a first delay queue and a second delay queue;

inputting from a source array outside the reconfigurable hardware, a first value into the first delay queue and a second value into the second delay queue;

defining in the reconfigurable hardware, a window array comprising a first cell and a second cell;

inputting the first value from the first delay queue into the first cell and the second value from the second delay queue into the second cell; and calculating an output value for the function array based on the window array.

2. The method of claim 1, wherein the first value and the second value of the source array are input into the reconfigurable hardware just once to compute the function array.

3. The method of claim 1, wherein the reconfigurable hardware comprises a field programmable gate array (FPGA).

4. The method of claim 1, wherein the source array is a two dimensional array.

5. The method of claim 1, wherein the function array is a two dimensional array.

6. The method of claim 5, wherein the function array is a median filter output array for image processing.

7. The method of claim 1, wherein the function array describes hydrodynamic behavior in a fluid system.

8. The method of claim 1, wherein the window array is a two dimensional array.

9. The method of claim 8, wherein the window array has dimensions of equal length.

10. The method of claim 1, wherein the first delay queue and the second delay queue comprise FIFO buffers.

11. The method of claim 1, wherein said method further comprises:

determining whether the output value is a junk value, wherein the output value is stored in a result array unless it is the junk value.

12. A method of loop stripmining comprising:
- forming in reconfigurable hardware, a first delay queue with a first length equal to a maximum number of values stored in the delay queue;
- forming first a sub-array from a first portion of a source array, wherein at least one dimension of the sub-array has a size equal to the first length of the first delay queue;
- loading values from the first sub-array into the first delay queue; and
- stepping the sub-array to a second portion of the source array.

13. The method of claim 12, wherein the reconfigurable hardware comprises a field programmable gate array (FPGA).

14. The method of claim 12, wherein the source array is a two-dimensional array having a depth and a width.

15. The method of claim 14, wherein the sub-array spans the width of the source array.

16. The method of claim 12, wherein the first portion and the second portion of the source array overlap by at least one row of the source array.

17. The method of claim 12, wherein said method further comprises forming in the reconfigurable hardware a second delay queue with a second length equal to the first length of the first delay queue.

18. The method of claim 17, wherein said method further comprises loading the values from the first delay queue into the second delay queue.

19. A method of calculating output values in a fused producer/consumer loop structure comprising:
- forming in a reconfigurable hardware, a first delay queue and a second delay queue;
- loading a first output value from a producer function into the first delay queue;
- loading a second output value from the producer function and loading into the first delay queue, wherein the first output value is loaded into the second delay queue; and
- inputting the first output value from the second delay queue, the second output value from the first delay queue, and a third output value from the producer function into a consumer function to calculate a consumer output value.

20. The method of claim 19, wherein the reconfigurable hardware comprises a field programmable gate array (FPGA).

* * * * *